(12) United States Patent
Gruber et al.

(10) Patent No.: US 8,833,636 B2
(45) Date of Patent: Sep. 16, 2014

(54) FORMING AN ARRAY OF METAL BALLS OR SHAPES ON A SUBSTRATE

(71) Applicant: International Business Machines Corporation, Armonk, NY (US)

(72) Inventors: Peter A. Gruber, Mohegan Lake, NY (US); Paul A. Lauro, Brewster, NY (US); Jae-Woong Nah, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/015,662

(22) Filed: Aug. 30, 2013

(65) Prior Publication Data

US 2014/0110462 A1 Apr. 24, 2014

Related U.S. Application Data

(62) Division of application No. 13/655,426, filed on Oct. 18, 2012, now Pat. No. 8,523,046.

(51) Int. Cl.
*B23K 31/02* (2006.01)
*H01L 21/44* (2006.01)
*B23K 1/008* (2006.01)
*B23K 3/06* (2006.01)
*B23K 1/00* (2006.01)
*B23K 1/20* (2006.01)
*B23K 3/08* (2006.01)

(52) U.S. Cl.
CPC ............... *B23K 1/203* (2013.01); *B23K 1/008* (2013.01); *B23K 3/0623* (2013.01); *B23K 2201/42* (2013.01); *B23K 1/0008* (2013.01); *B23K 3/08* (2013.01)

USPC ...... 228/170; 228/180.22; 228/223; 228/246; 438/613

(58) Field of Classification Search
None
See application file for complete search history.

(56) References Cited

U.S. PATENT DOCUMENTS

| | | |
|---|---|---|
| 2,083,081 A | 6/1937 | Moll |
| 3,309,892 A | 3/1967 | O'Connell et al. |
| 5,244,143 A | 9/1993 | Ference |
| 5,431,332 A | 7/1995 | Kirby et al. |
| 5,735,452 A | 4/1998 | Yu et al. |
| 5,938,106 A | 8/1999 | Pierson |
| 6,056,190 A | 5/2000 | Foulke et al. |
| 6,056,191 A | 5/2000 | Brouillette et al. |
| 6,090,301 A | 7/2000 | Mizukoshi |
| 6,153,505 A | 11/2000 | Bolde et al. |
| 6,165,885 A * | 12/2000 | Gaynes et al. ............... 438/612 |
| 6,231,333 B1 | 5/2001 | Gruber et al. |
| 6,234,382 B1 | 5/2001 | Rischke et al. |
| 6,239,013 B1 * | 5/2001 | Hotchkiss ............... 438/616 |
| 6,332,569 B1 | 12/2001 | Cordes et al. |
| 6,340,630 B1 | 1/2002 | Berger et al. |
| 6,394,334 B1 | 5/2002 | Brouillette et al. |

(Continued)

FOREIGN PATENT DOCUMENTS

JP 08-309523 A * 11/1996

*Primary Examiner* — Kiley Stoner
(74) *Attorney, Agent, or Firm* — Louis J. Percello; Robert M. Trepp (57) ABSTRACT

A process and apparatus for forming and transferring metal arrays of balls and shapes is described incorporating molds, tape, injection molded metal such as solder, metal reflow and a mask on a substrate for shearing solidified metal of metal arrays into respective openings in the mask.

10 Claims, 11 Drawing Sheets

(56) References Cited

U.S. PATENT DOCUMENTS

| | | |
|---|---|---|
| 6,527,158 B1 | 3/2003 | Brouillette et al. |
| 6,528,346 B2 | 3/2003 | Ochiai et al. |
| 6,919,634 B2 * | 7/2005 | Kuramoto et al. ............ 257/738 |
| 7,156,361 B1 | 1/2007 | Akram |
| 7,332,424 B2 | 2/2008 | Belanger |
| 7,506,794 B1 | 3/2009 | Cordes et al. |
| 7,980,446 B2 | 7/2011 | Buchwalter et al. |
| 8,132,775 B2 | 3/2012 | Goldman |
| 8,162,203 B1 | 4/2012 | Gruber et al. |
| 8,342,387 B2 | 1/2013 | Gruber et al. |
| 8,523,046 B1 * | 9/2013 | Gruber et al. ................ 228/246 |
| 2002/0125402 A1 | 9/2002 | Cordes et al. |
| 2003/0013228 A1 * | 1/2003 | Hotchkiss et al. ............ 438/106 |
| 2003/0092252 A1 * | 5/2003 | Nishiyama et al. ............ 438/613 |
| 2004/0145064 A1 * | 7/2004 | Kuramoto et al. ............ 257/780 |
| 2005/0150936 A1 * | 7/2005 | Mackay ........................ 228/254 |
| 2005/0263571 A1 | 12/2005 | Belanger et al. |
| 2006/0035454 A1 | 2/2006 | Belanger et al. |
| 2006/0289607 A1 | 12/2006 | Buchwalter et al. |
| 2007/0246516 A1 | 10/2007 | Cordes et al. |
| 2007/0246853 A1 | 10/2007 | Chey et al. |
| 2008/0003804 A1 * | 1/2008 | Nalla et al. .................... 438/613 |
| 2008/0164609 A1 | 7/2008 | Gruber |
| 2008/0176393 A1 * | 7/2008 | Mackay ........................ 438/613 |
| 2008/0272177 A1 | 11/2008 | Cordes et al. |
| 2009/0014502 A1 * | 1/2009 | Itoh et al. .................... 228/179.1 |
| 2009/0020590 A1 | 1/2009 | Knickerbocker et al. |
| 2009/0039142 A1 | 2/2009 | Bezama et al. |
| 2009/0057372 A1 * | 3/2009 | Niizuma et al. .................. 228/9 |
| 2009/0072011 A1 * | 3/2009 | Sakaguchi et al. ........... 228/245 |
| 2009/0072392 A1 | 3/2009 | Dang et al. |
| 2009/0120999 A1 | 5/2009 | Indyk et al. |
| 2009/0159651 A1 * | 6/2009 | Sunohara et al. ............. 228/246 |
| 2009/0176321 A1 | 7/2009 | Park |
| 2009/0200665 A1 * | 8/2009 | Jobetto et al. ................. 257/737 |
| 2009/0302096 A1 * | 12/2009 | Budd et al. .................... 228/246 |
| 2009/0309219 A1 | 12/2009 | Gruber |
| 2010/0001045 A1 | 1/2010 | Cordes et al. |
| 2010/0116871 A1 | 5/2010 | Gruber et al. |
| 2011/0092066 A1 | 4/2011 | Mackay |
| 2011/0127312 A1 | 6/2011 | Gruber et al. |
| 2012/0132694 A1 | 5/2012 | Buchwalter et al. |
| 2012/0138769 A1 | 6/2012 | Dang et al. |
| 2012/0193833 A1 | 8/2012 | Budd et al. |
| 2012/0273155 A1 | 11/2012 | Gruber et al. |

* cited by examiner

FORMING AN ARRAY OF METAL BALLS OR SHAPES ON A SUBSTRATE

CROSS REFERENCED TO A RELATED APPLICATION

This application is cross referenced to U.S. patent application Ser. No. 13/371,430 filed on Feb. 11, 2012 entitled "FORMING METAL PREFORMS AND METAL BALLS" filed by the same inventor entity as the inventor entity herein and assigned to the assignee herein which is directed to an apparatus and method for forming metal preforms, metal shapes and metal balls with controlled diameters of the same size utilizing injection molded metal and metal reflow in molds and is incorporated herein by reference.

This application is cross referenced to U.S. patent application Ser. No. 13/371,431 filed on Feb. 11, 2012 now U.S. Pat. No. 8,408,448 which issued on Apr. 2, 2013 entitled "FORMING CONSTANT DIAMETER SPHERICAL METAL BALLS" assigned to the assignee herein which is directed to an apparatus and method for forming a plurality of constant diameter spherical metal balls utilizing injection molded metal and unconstrained metal reflow and is incorporated herein by reference.

BACKGROUND

The present invention relates to forming an array of metal balls or shapes on a decal or tape and more specifically, to metal ball arrays or to metal shape arrays formed by injection molding metal (solder) and transferring the metal ball arrays or metal shape arrays from the decal or tape to conductive contacts on a substrate or semiconductor chip.

BRIEF SUMMARY OF THE INVENTION

In accordance with the present invention, a method of forming an array of metal balls on a polymer layer is described comprising
selecting a polymer layer,
positioning a mold substrate having an array of through-hole cavities therein over the polymer layer to form respective cavities comprising sidewalls of the through-hole cavities and a bottom wall of the polymer layer,
filling the array of through-hole cavities with molten metal,
solidifying the molten metal,
removing the mold substrate from over the solidified molten metal and from over the polymer layer whereby solidified molten metal remains on the polymer layer; and
reflowing the solidified molten metal in a gaseous environment to form an array of near spherical metal balls on the polymer layer to minimize a contact area of the respective near spherical metal balls with the polymer layer.

The present invention further describes a method for transferring an array of metal balls on a polymer layer to an array of metal contacts on a substrate comprising
selecting an array of contacts on the substrate,
forming a flux over respective contacts of the array of contacts on the substrate,
forming on the substrate a first mask having through-hole openings corresponding to the respective contacts of the array of contacts,
the through-hole openings having a depth and a width for receiving metal balls of the array of metal balls on the polymer layer,
the first mask having mechanical strength to maintain a shape of the through-hole openings under shear forces to permit shearing the metal balls of the array of metal balls,
positioning respective metal balls of the array of metal balls on the polymer layer into the through-hole openings of the first mask,
moving the first mask sideways with respect to the substrate and the array of metal balls at least the width of a metal ball to shear the array of metal balls and stopping the first mask where the through-holes are over the contacts whereby the metal balls of the array of metal balls are over the flux and respective contacts,
heating the metal balls to reflow the metal to wet the respective contacts in the presence of the flux,
solidifying the metal over the contacts, and
removing the flux.

Apparatus for forming a tape containing solidified metal is described comprising:
a first tape having a length and having a plurality of through-hole cavities therein;
a second tape having a length and having an upper surface; said first and second tape capable of withstanding a temperature of molten metal;
first and second guides spaced apart to provide a path there between for joining one surface of said first tape to the upper surface of said second tape to form a third tape having blind cavities; and
a first work station and a second work station positioned in series after the first and second guides along the path taken by the third tape;
the first work station having an injection molding solder tool for injecting molten metal into blind cavities,
the second work station having a temperature below the temperature of molten metal to solidify the molten metal in the blind cavities.

The present invention further describes an apparatus for transferring metal solidified in cavities in a first layer of a tape comprising:
selecting a tape containing solidified metal in cavities in a first layer and having a second layer having an upper surface bonded to a lower surface of the first layer, said upper surface of the second layer forming a bottom wall of the cavities, said tape having a width, thickness and length;
a first work station comprising first and second guides spaced apart to provide a first path there between and for directing the second layer and solidified metal along a second path and for separating and directing the first layer without the solidified metal along a third path;
a second work station and a third work station positioned in series after the first work station along said second path taken by the second layer;
the second work station having a substrate with a first mask thereon having corresponding openings in a pattern matching a pattern of the solidified metal on the second layer; the openings in the first mask having a width and depth to receive the solidified metal, the openings in the first mask having sidewalls to withstand predetermined lateral forces,
the second workstation having a means for positioning said pattern of openings of the first mask to receive the pattern of solidified metal on the second layer, and for moving the first mask together with the second layer as the second layer is moved to a third work station,
the third work station having a plate for applying pressure to the lower surface of the second layer and means for moving the substrate and first mask laterally with respect to the second layer to shear off said solidified metal in respective openings of the first mask and means for moving the first mask, solidified metal and substrate away from the second layer whereby the solidified metal has been transferred.

Apparatus for transferring a metal array on a surface of a tape to a substrate is described comprising:

a tape head having first and second guides for guiding a tape past a work station on the tape head, the work station positioned on a path between the first and second guides, the work station having a plate for supporting the tape, the metal array having a pattern of spaced apart solidified metal on the upper surface of the tape;

means for aligning the pattern at the work station with a mask on a substrate, means for moving the tape from the first guide to said second guide to position the metal array at the work station, means for positioning the work station to position the solidified metal of the metal array in respective openings of the mask on the substrate, and means for moving the tape relative to the mask a distance whereby solidified metal of the metal array on the tape is sheared off at times said solidified metal in respective openings is resisted by a sidewall of respective openings of the mask on the substrate.

BRIEF DESCRIPTION OF THE SEVERAL VIEWS OF THE DRAWINGS

These and other features, objects, and advantages of the present invention will become apparent upon consideration of the following detailed description of the invention when read in conjunction with the drawing in which.

DETAILED DESCRIPTION

Figure 1:
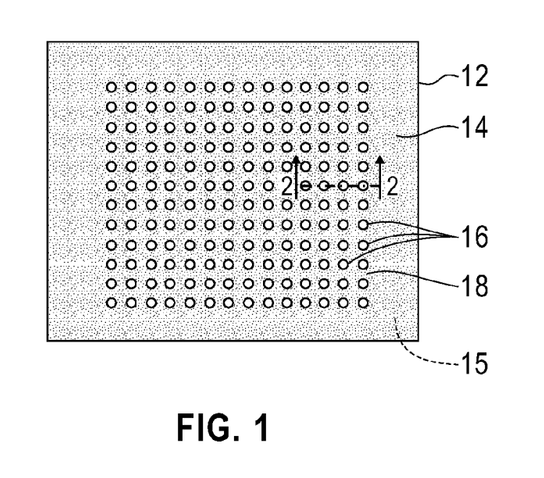
FIG. 1 shows a top view of a mold substrate having through-holes cavities.

Referring now to the drawing, FIG. 1 shows a top view of mold substrate 12 which may be flexible and planar or flat comprising a polymer such as a polyimide or polyamide, or a glass, a metal, a graphite or a ceramic capable of withstanding the temperature of molten metal such as 400° C. Mold substrate 12 should comprise materials which are hydrophobic and which molten metal such as a solder does not wet. Mold substrate 12 may have an upper surface 14, a lower surface 15 and a plurality of cavities 16. Plurality of cavities 16 may be arranged in a pattern or array corresponding to a pattern or array of contacts on a semiconductor chip. FIG. 1 shows a pattern or array of cavities in a two dimensional array 18 of rows and columns spaced apart in the range from 0.002 mm to 12.7 mm, respectively. Plurality of cavities 16 have a height corresponding to the thickness of mold substrate 12. Plurality of cavities 16 may change elastically from a first shape 20 to another shape such as a second shape at times mold substrate 12 is lifted, bent or flexed to remove or separate mold substrate 12 from over solidified molten metal in cavities 16 and from over a polymer layer 32 shown in FIG. 3.

Figure 2:
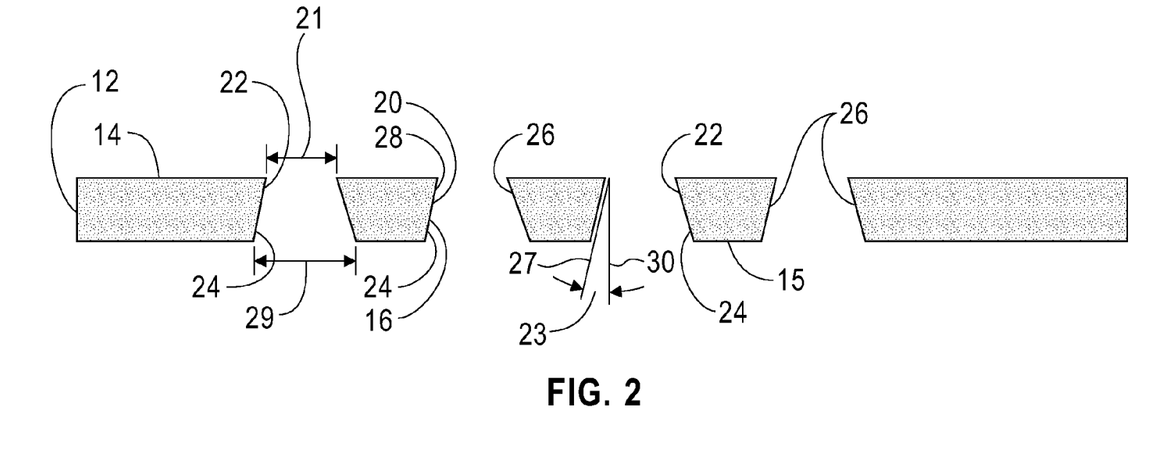
FIG. 2 is a cross-section view along the lines 2-2 of FIG. 1.

FIG. 2 is a cross-section view along the lines 2-2 of FIG. 1. Plurality of cavities 16 are shown with through-holes having upper opening 22 which is circular having a diameter shown by arrow 21 and lower opening 24 which is circular having a diameter shown by arrow 29. Lower opening 24 is larger than upper opening 22. Plurality of cavities 16 have a diameter in the range from 0.0025 mm to 0.89 mm at lower opening 24. Plurality of cavities 16 have sidewalls 26 which are shown sloping outwards as the depth increases such as a truncated portion of a cone. Cavities 16 may be space apart on a center-to-center spacing in the range from 0.002 mm to 12.7 mm to enable flexible mold material there between to adequately support first shape 20 of plurality of cavities 16 when not being flexed. Plurality of cavities 16 may be formed with an ultra violet laser (UV) and/or eximer laser and may have a wall taper in the range from 4° to 10° shown by arrow 23 between a line 27 parallel to sidewall 26 and reference line 30 perpendicular to bottom surface 15.

Plurality of cavities 16 may have an aspect ratio, depth to width ratio, in the range from ⅓ to ⅔. The depth of cavity 16 may be in the range from ⅓ to 1 and more preferably ½ the depth of the final metal (solder) ball.

Figure 3:
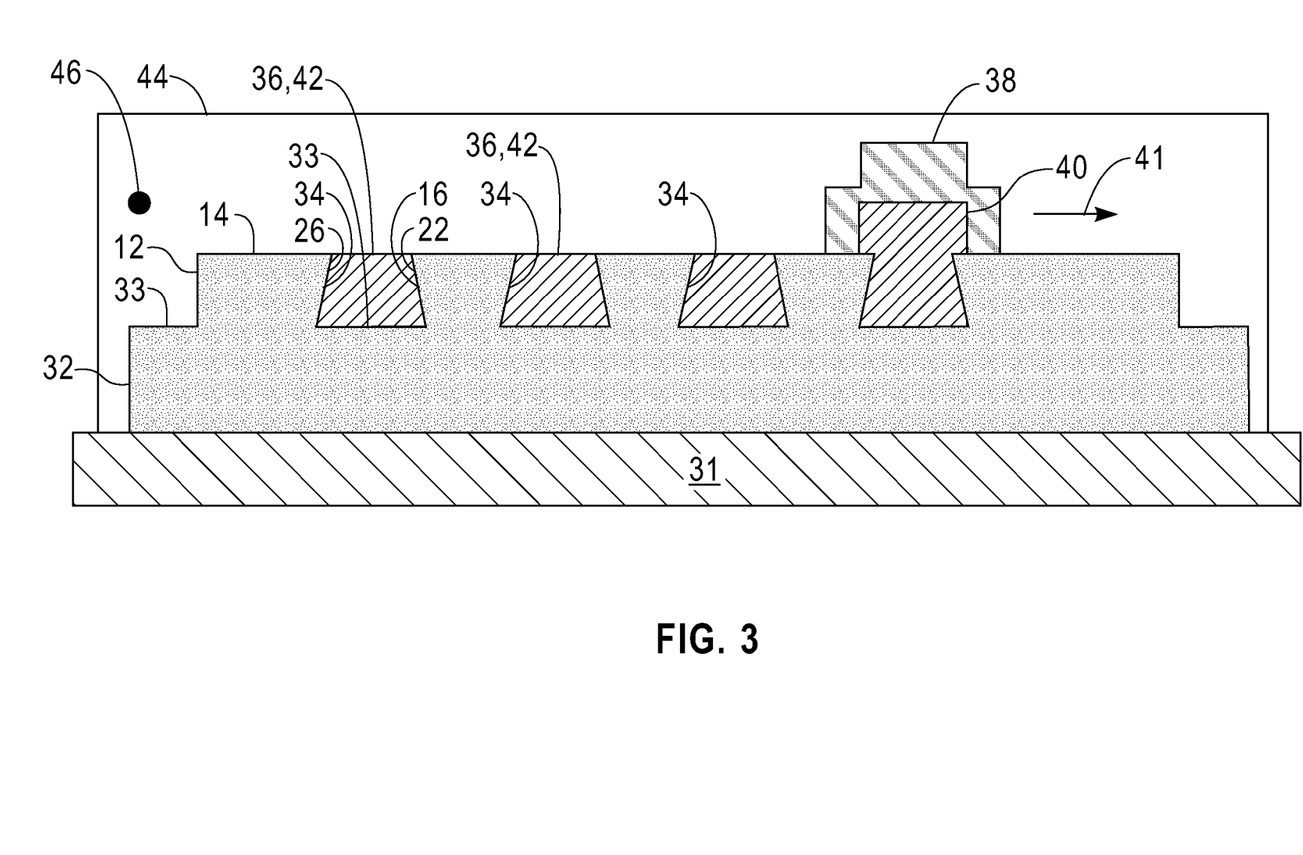
FIG. 3 is a cross-section view of a polymer layer and mold substrate having through-hole cavities filled with molten metal.

FIG. 3 is a cross-section view of rigid plate 31, polymer layer 32 and mold substrate 12 which is positioned on polymer layer 32. Rigid plate 31 provides support to polymer layer 32. Polymer layer 32 and mold substrate 12 function to form cavities 34. Cavities 34 comprise through-hole cavities 16 of mold substrate 12 having a bottom wall comprising the upper surface 33 of polymer layer 32. Cavities 34 have a diameter in the range from 0.0025 mm to 0.89 mm at the bottom wall. Cavities 34 are filled with molten metal 36 such as by injection molding solder (IMS) such as by IMS tool 38 shown on upper surface 14 of mold substrate 12. IMS tool 38 has a reservoir 40 of molten metal or solder. IMS tool 38 functions to move in the direction of arrow 41 and sweep molten metal or solder along upper surface 14 into cavities 34 and leaves an upper surface 42 of molten metal 36 in plurality of cavities 34 coplanar with upper surface 14 of mold substrate 12. If molten metal 36 is in an oxygen environment, a metal oxide or oxide material will form on upper surface 42. Oxide material, if formed, may be a uniform layer with a smooth surface and may be thicker than 0.01 μm. Housing 44 encloses mold substrate 12, polymer layer 32 and IMS tool 38 and functions to provide a low oxygen atmosphere or an inert gas 46 such as nitrogen ($N_2$) in housing 44 to prevent oxygen from forming on molten metal 36. With a low oxygen atmosphere in the range from 10 to 1000 ppm, the upper surface of molten solder is free or substantially free of oxide material especially at the location where upper surface 42 and sidewall 26 meet, join or intersect at the edge of opening 22 of cavities 34. The edge of opening 22 is initially in contact with molten metal 36 but if free of metal oxide, molten metal 36 will pull away from upper surface 14 and sidewall 26 and ball up due to the surface tension of molten metal 36.

Molten metal 36 is subsequently cooled below the melting temperature of molten metal 36 to form solid metal 36'. Molten metal 36 may be selected from the group consisting of Sn, In, Sn—In, Sn—Pb, Sn—Au, Sn—Ag, Sn—Cu, Ag—Bi, Sn—Ag—Cu, Sn—Ag—Bi, Sn—Ag—Cu—Zn, Sn—Ag—Cu—Bi, Sn—Ag—Cu—Pd, Sn—Ag—Cu—Ti, Sn—Ag—Cu—Al, Sn—Ag—Cu—Sb, Sn—Ag—Cu—Ce, Sn—Ag—Cu—Ge, Sn—Ag—Cu—Mn, Sn—Ag—Cu—La and combinations thereof.

Figure 4:
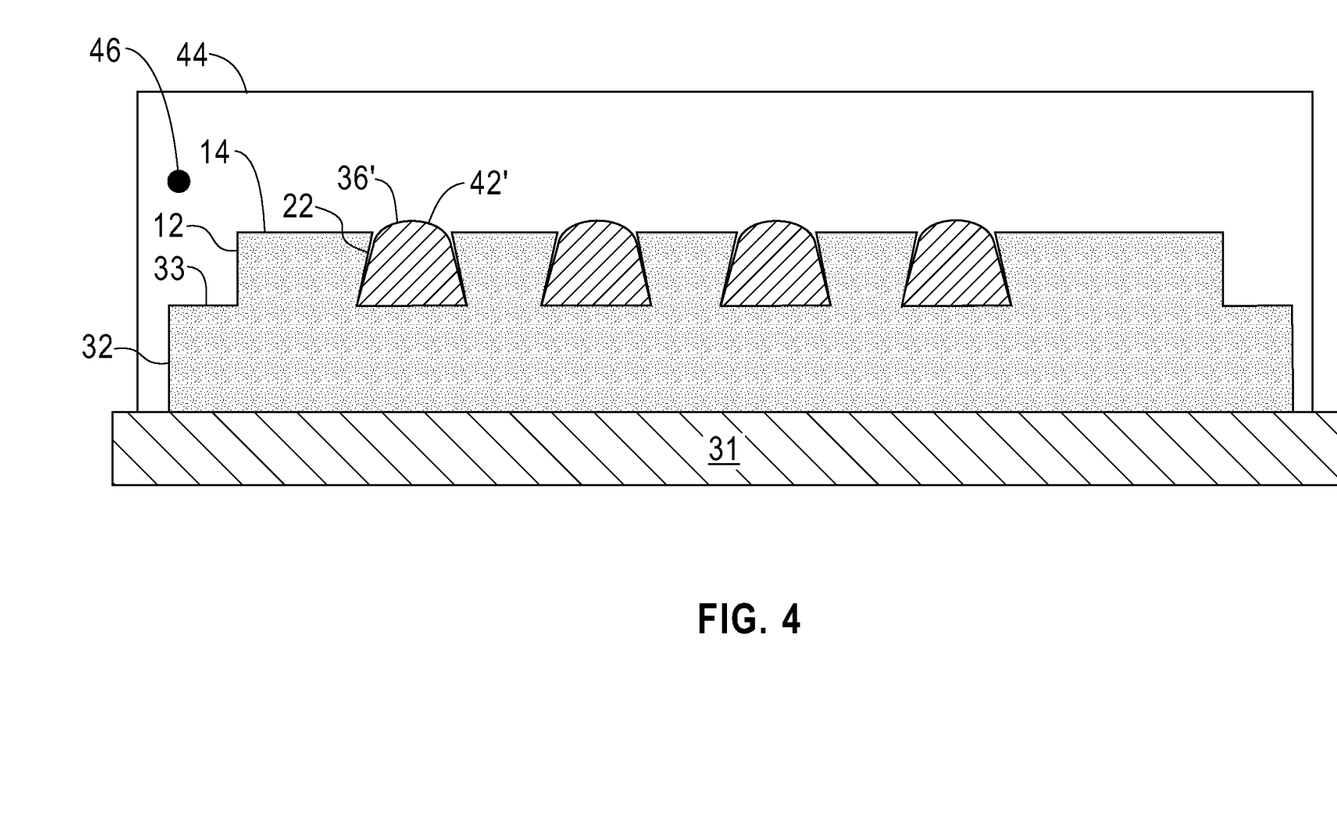
FIG. 4 is a cross-section view as shown in FIG. 3 after molten metal has solidified.

FIG. 4 is a cross-section view as shown in FIG. 3 after molten metal 36 has solidified to form solidified molten solder 36' As shown in FIG. 4, solidified molten solder 36' has a rounded upper surface 42'. Solidified molten solder 36' has pulled away from the edges of opening 22 due to surface tension of molten solder 36 prior to solidifying.

Figure 5:
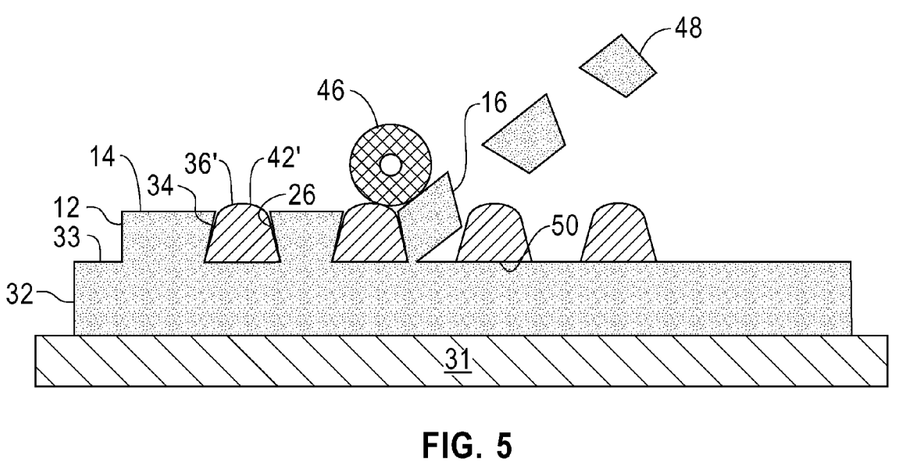
FIG. 5 is a cross-section view in part as shown in FIG. 4 except with partial removal of the polymer layer.

FIG. 5 is a cross-section view as shown in FIG. 4 except with partial removal of mold substrate 12. End 48 of mold substrate 12 may be lifted in a controlled manner. Roller 46 which may be pressed against mold substrate 12 as end 48 of mold substrate 12 is bended or lifted up against roller 46 as roller 46 is rolled over mold substrate 12 separating mold substrate 12 from solidified molten metal 36' and polymer layer 32. The ball up of solidified molten metal 36' away from the edges of opening 22 aids in the removal of mold substrate 12 without inadvertently lifting or removing solidified molten metal 36'. The bottom surface 50 of solidified molten metal 36' has the area of opening 24 and has a large contact area to upper surface 33 to increase the bonding forces to upper surface 33. The taper of sidewalls 26 of cavities 34 also aid in the removal of mold substrate 12 without inadvertently removing solidified molten metal 36'.

Figure 6:
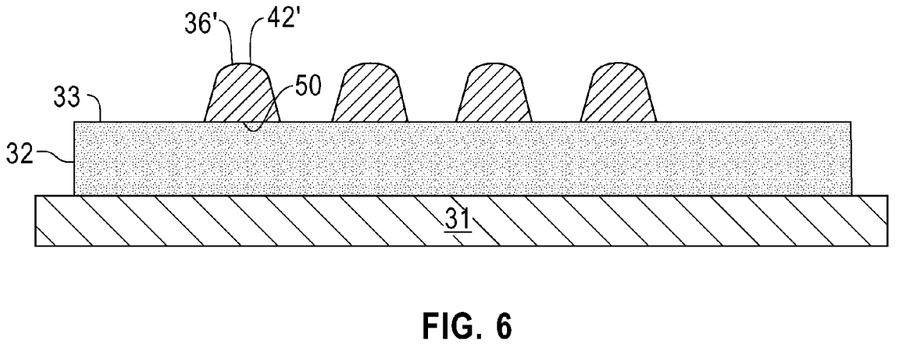
FIG. 6 is a cross-section view of solidified molten solder on a decal or tape.

FIG. 6 is a cross-section view of as shown in FIG. 5 except with the complete removal of mold substrate 12. As shown in FIG. 6, solidified molten metal 36' has a large bottom surface 50 in contact with upper surface 33 of polymer layer 32. Upper surface 42' as shown in FIGS. 4-6 should be free of metal oxides.

Figure 7:
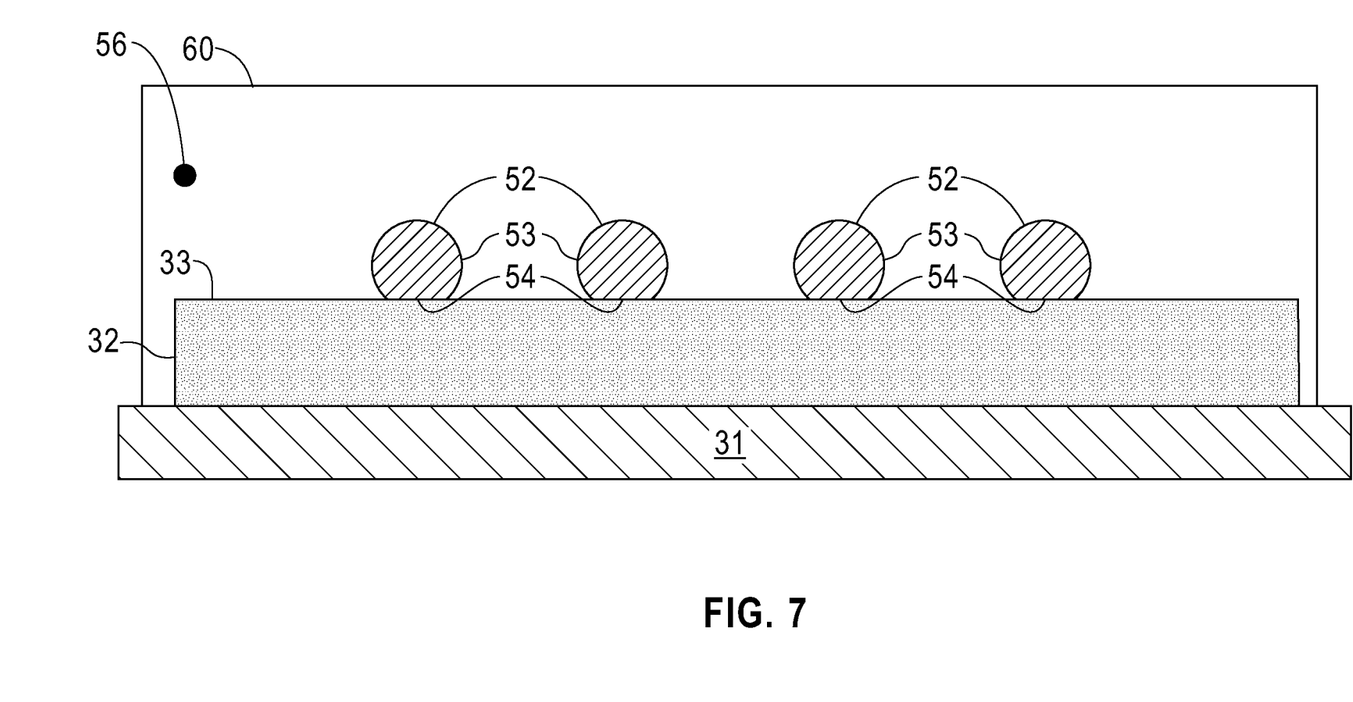
FIG. 7 is a cross-section view of FIG. 6 after molten metal reflow.

FIG. 7 is a cross-section view of FIG. 6 after reflow of solidified molten metal 36'. Reflow of solidified metal 36' is performed by heating solidified metal 36' in a liquid or gaseous flux environment 56 that eliminates metal oxides from forming on upper surface 42. Housing 60 encloses rigid plate 31, polymer layer 32 and solidified molten metal 36' and functions to provide a low oxygen atmosphere or an inert gas 56 such as nitrogen ($N_2$) in housing 60 to prevent oxygen from forming on molten metal 36. A flux is a reducing agent designed to help reduce or return oxidized metals to their metallic state. One gaseous flux suitable for solder is formic acid (HCOOH) diluted with nitrogen in a bubbler. Another gaseous flux may be forming gas which is a mixture of hydrogen ($H_2$) and an inert gas usually nitrogen ($N_2$) that works well to reduce oxides on metal surfaces 42 shown in FIG. 3 to form metal and water. $H_2$ may be in the range from 8 to 25 volume percent in an inert gas. Another gaseous flux may be hydrogen ($H_2$) at 100 percent. A liquid flux, if applied, is removed in a subsequent cleaning step. By raising the temperature of solidified molten metal 36' above the melting point and with metal oxides removed or eliminated on surface 42', the surface tension of molten solder 36 will increase and reflow to form spherical, near spherical, or substantially spherical balls 52 on upper surface 33 as shown in FIG. 7. As shown in FIG. 7, substantially spherical balls 52 remain in contact with bottom surface 54. While solder does not wet glass or polyimide, spherical balls 52 form a bond with glass or polyimide that is surprisingly difficult to break causing near spherical solder balls. Further, the formation of or retention of solder oxides should be minimized, since solder oxides make spherical balling of solder much more difficult due to reduced surface tension. Further, metal oxides of solder on surface 53 of spherical or near spherical balls 52 may bond via bottom surface 54 to upper surface 33 of polymer layer 32 forming near spherical solder balls.

The uniform size, volume or dimensional tolerance of spherical, near or substantially spherical metal balls 52 such as the volume and diameter corresponds to the uniform size of cavities 34 formed by mold substrate 12 and upper surface 33 which determines the volume of metal in substantially spherical metal balls 52. The molten metal in the cavities 34 and reflow of the molten metal is in contact and constrained by upper surface 33 of polymer layer 32. Upper surface 33 where contacted is a constraining force on the molten metal and any metal oxides thereon. The constraining force by upper surface 33 and gravity will act to deform metal balls 52 and is counteracted by the force or magnitude of the molten metal surface tension.

Figure 8:
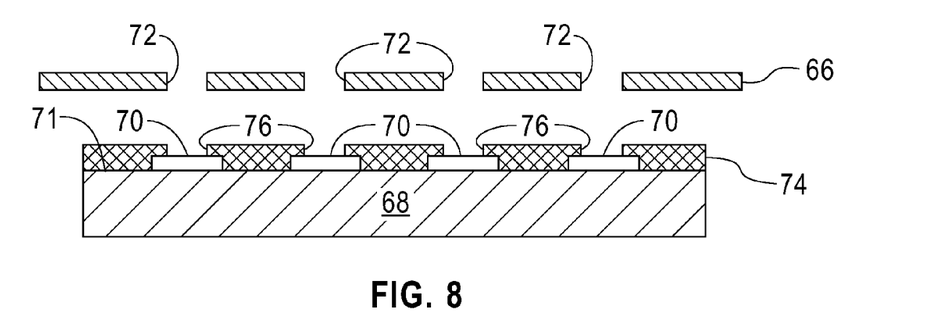
FIG. 8 is a cross-section view of a first alignment mask and a substrate having a plurality of contacts.

Referring to FIG. 8, a cross-section view of a first alignment mask 66 and a substrate 68 having a plurality of contacts 70 on upper surface 71 of substrate 68 is shown. First alignment mask 66 has openings 72 above corresponding plurality of contacts 70. Substrate 68 may be an organic material such as a polymer and may have a thickness to provide support for limited bending. A layer 74 is formed over upper surface 71 of substrate 68 having openings 76 to permit access to plurality of contacts 70 which may be formed on upper surface 71.

Figure 9:
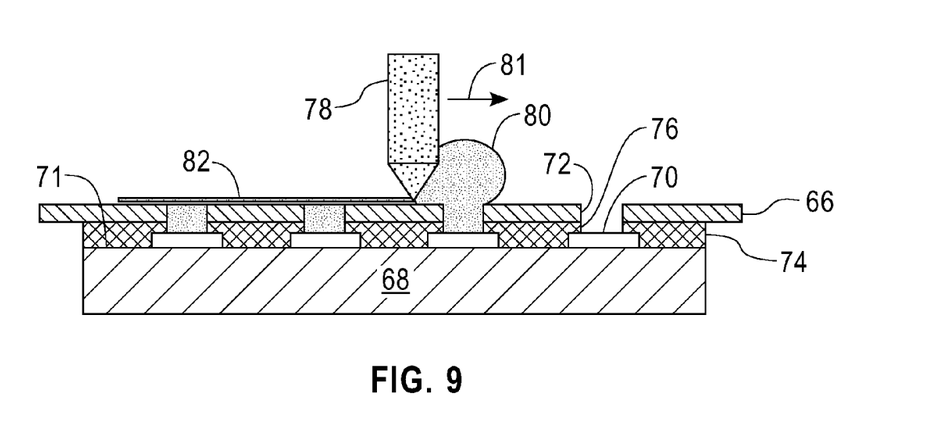
FIG. 9 is a cross-section view showing a squeegee applying tacky flux to a plurality of contacts on a substrate.

Referring to FIG. 9, a cross-section view showing a first alignment mask positioned on layer 74 with openings 72 aligned with openings 76. As shown in FIG. 9, the diameter of openings 72 and equal to the diameter of openings 76. Openings 72 and 76 may be an array of openings corresponding to respective contacts of an array of contacts on upper surface 71. In FIG. 9, squeegee 78 is positioned on first alignment mask 66 behind flux 80 which is also positioned on first alignment mask 66. Squeegee 78 is moved along on first alignment mask 66 in the direction shown by arrow 81 for applying flux 80 which may be tacky through first alignment mask 66, openings 72 and 76 to plurality of contacts 70 on a substrate 68. A residual layer 82 of flux 80 which may be very thin may remain on first alignment mask 66 behind squeegee 78.

Figure 10:
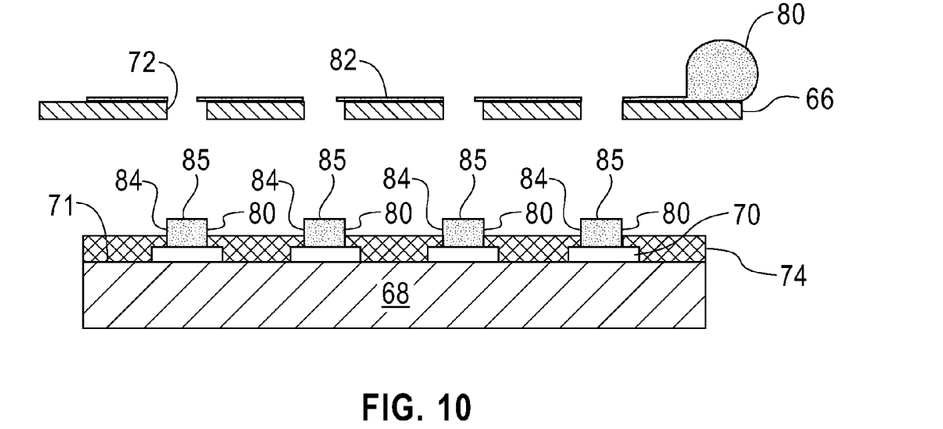
FIG. 10 is a cross-section view as shown in of FIG. 9 except a first alignment mask has been lifted off a substrate.

Referring to FIG. 10, a cross-section view as shown in of FIG. 9 is shown except squeegee 78 (not shown) has been lifted off first alignment mask and first alignment mask 66 has itself been lifted off layer 74. Openings 76 remain over contacts 70. Openings 76 are completely filled with flux 80. Flux 80 which had completely filled opening 72 of first alignment mask 66 also remains above openings 76 to form pedestals 85 having a flat upper surface 84.

Figure 11:
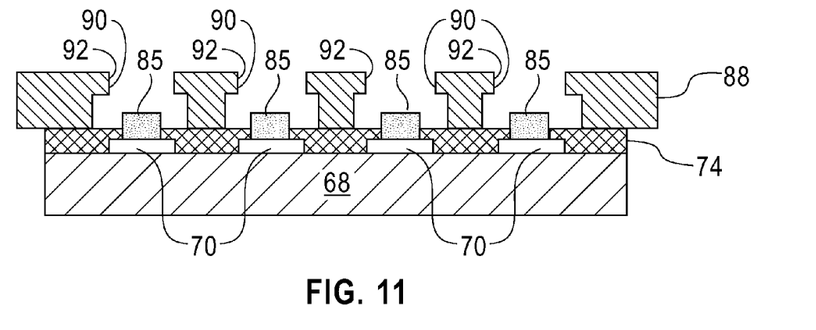
FIG. 11 is a cross-section view as shown in FIG. 10 with a second mask positioned on a substrate.

FIG. 11 shows a cross-section view as shown in FIG. 10 except without first alignment mask 66 and with the addition of second alignment mask 88 positioned on a layer 74. Second alignment mask 88 has an array of through-hole openings 90 corresponding to pedestals 85 over contacts 70. Through-hole openings 90 have a depth and width for receiving an array of metal balls having a spacing to align with pedestals 85 over contacts 70. Second alignment mask 88 has mechanical strength to maintain sufficient shape of the sidewalls 92 of through-hole openings 90 under lateral shear forces to permit shearing metal balls of the array of metal balls when positioned in respective openings 90 and moved laterally against sidewalls 92.

Figure 12:
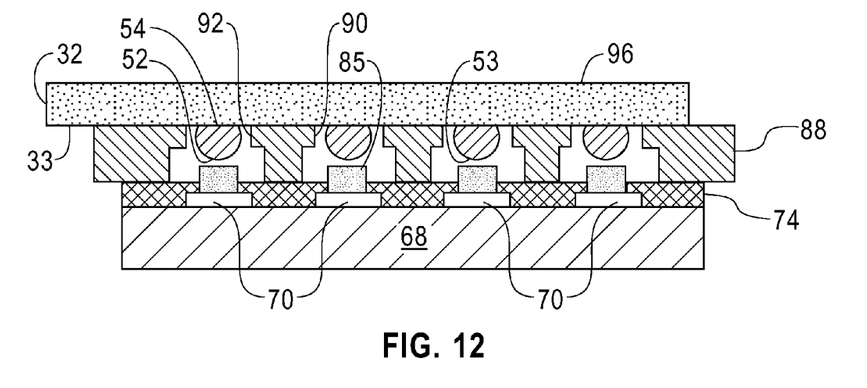
FIG. 12 is a cross-section view as shown in FIG. 11 with a decal positioned on a second mask with metal on the decal positioned in the second mask openings.

FIG. 12 is a cross-section view as shown in FIG. 11 with a decal 96 positioned on second mask 88 with metal balls 52 by way of bottom wall 54 shown in FIG. 7 bonded to decal 96 positioned in respective holes of through-hole openings 90.

Figure 13:
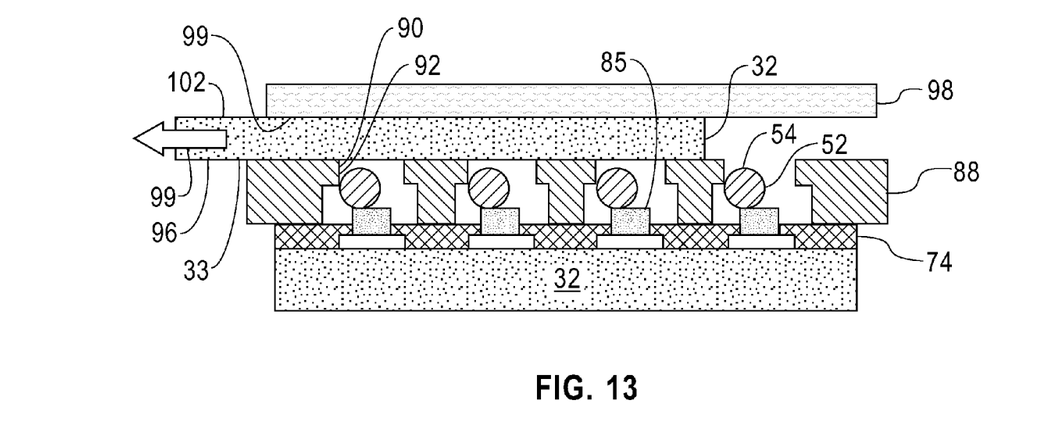
FIG. 13 is a cross-section view showing metal sheared by movement of a decal.

FIG. 13 is a cross-section view showing metal balls 52 sheared from upper surface 33 of polymer layer 32 by movement of a decal 96. Polymer layer 32 is pushed against second alignment mask 88 by a low-friction plate 98. Low-friction plate 98 has a surface 99 in contact with the lower surface 102 of polymer layer 32 and functions to hold polymer layer 32 against second alignment mask 88 while sliding or laterally moving as shown by arrow 99. Surface 99 of low-friction plate 98 may comprise metal, wood, silicon, glass or a polymer. Second alignment mask 88 also has a low friction surface 104 which slides against upper surface 33 of polymer layer 32 of decal 96. Metal balls 52 are pulled against the left sidewalls 92 of openings 90. Metal balls 52 with bottom surface 54 shown in FIG. 7 is sheared or broken loose from upper surface 33 and fall under gravity in opening 90 landing on pedestal 85 as shown in FIG. 13. Metal balls 52 and decal 96 as well as second alignment mask may be at room temperature during shearing operations. The physical transfer of metal balls 52 from a decal to a semiconductor chip may be done at room temperature. FIG. 13 shows metal balls 52 on the left side of pedestals 85 after first shearing metal balls by way of left sidewall 92 of second alignment mask 88.

Figure 14:
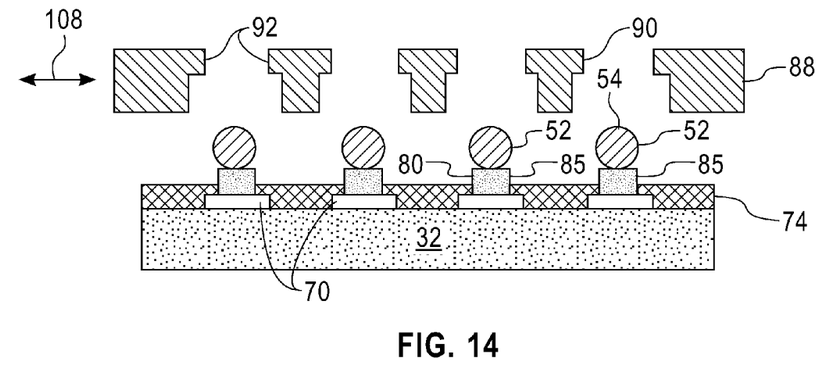
FIG. 14 is a cross-section view after the metal has been sheared from a decal and positioned on sticky flux in the second mask openings.

FIG. 14 is a cross-section view after the metal balls 52 have been sheared from upper surface 33 of polymer layer 32 of decal 96 and positioned on pedestals 85 of flux 80. In FIG. 14 low-friction plate 98 and decal 96 has been removed. Second alignment mask 88 may be moved left or right as shown by arrow 108 to center metal balls 52 on pedestals 85 as shown in FIG. 14.

Figure 15:
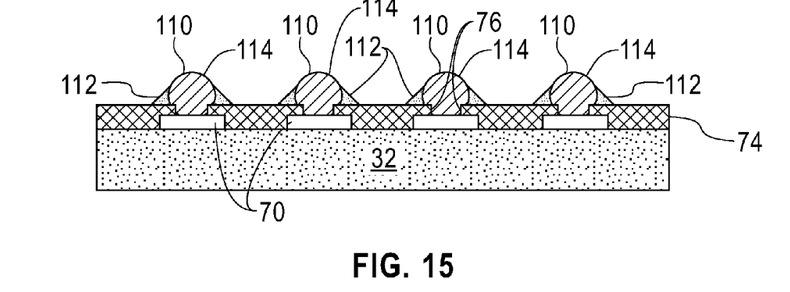
FIG. 15 is a cross section view showing metal reflow and a flux residue.

FIG. 15 is a cross section view showing metal reflow with flux 112. FIG. 15 shows molten or liquid metal balls 110 after heating metal balls 52 shown in FIG. 14 above the melting temperature of metal balls 52. Metal balls 52 reflow under the influence of flux 112 to eliminate or reduce any surface oxides on exposed surface 114 of metal balls 110 allowing maximum surface tension. Molten metal balls 110 wet and rest on respective contacts 70 below metal balls 110 after passing through flux 112. Metal balls 52 as shown in FIG. 14 were on pedestals 85 of flux 80 and deform under the weight of molten metal balls 110. Molten metal balls 110 maintain a spherical shape on exposed surface 114 due to surface tension of molten metal balls 110. The shape of molten metal balls 110 where in contact with layer 74, opening 76 and contact 70 conforms to the respective surfaces.

Figure 16:
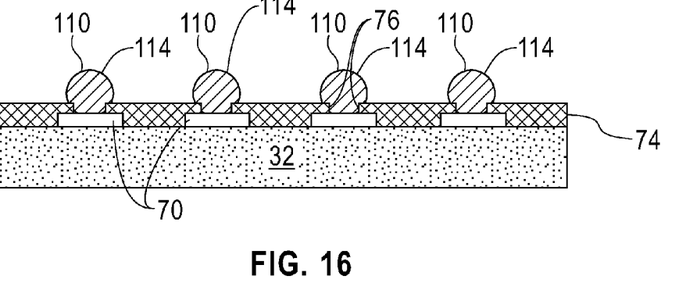
FIG. 16 is a cross-section view as shown in FIG. 15 with the flux residue removed.

FIG. 16 is a cross-section view as shown in FIG. 15 after molten metal balls 110 have cooled and solidified and with flux 112 removed.

Figure 17:
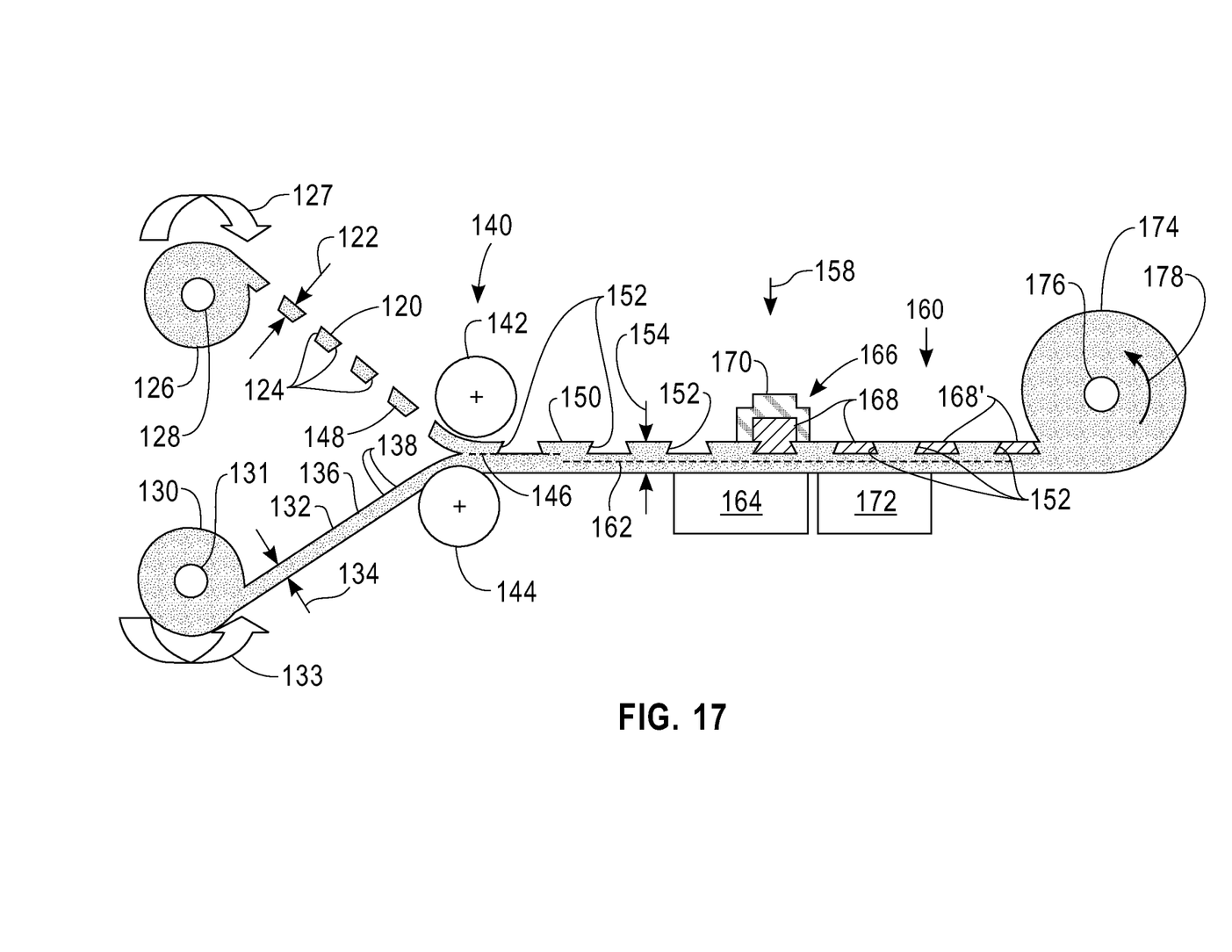
FIG. 17 is a cross-section view of a reel to reel apparatus for filling a mold with molten metal and cooling to form solidified metal arrays.

FIG. 17 is a cross-section view of a reel to reel apparatus for filling a mold with molten metal and for cooling molten metal to form solidified metal arrays. A first tape 120 has a thickness shown by arrow 122, a width and a plurality of through-hole cavities 124. Through-hole cavities 124 are arranged in a pattern corresponding to a contact pattern on a semiconductor chip or other device. First tape 120 has a length for passing through several work stations. First tape 120 may be originally wound on a first feed reel 126 and then unwound as shown by arrow 127 as first reel 126 rotates around axis 128 and fed into a first station 140. A second feed reel 130 has a second tape 132 wound thereon. Second tape 132 is unwound from second feed reel 130 as shown by arrow 133 as second feed reel 130 rotates around axis 131 to be feed into first station 140. Second tape 132 has a thickness shown by arrow 134, a width and a continuous upper surface 136 at least in certain areas 138 to provide a bottom wall for a plurality of through-hole cavities 124 in first tape 120. Second tape 132 has an upper surface 136 of a material selected for withstanding a temperature of molten metal.

A first work station 140 has a first guide 142 and a second guide 144 spaced apart to provide a path 146 there between for joining one surface 148 of first tape 120 to upper surface 136 of second tape 132 to form a third tape 150 having blind cavities 152 as said first tape 120 and second tape 132 are joined passing between first guide 142 and second guide 144. First guide 142 and second guide 144 may be rollers rotating about a respective axis. First tape 120 and second tape 132 join together to form third tape 150. Third tape 150 has a thickness shown by arrow 154 and a width determined by either first tape 120 or second tape 132 or by both tapes having a partial overlap.

A second work station 158 and a third work station 160 are positioned in series after first work station 140 along a path 162 taken by third tape 150. Second work station 158 has a heater 164 for heating third tape 150 and an injection molding solder tool 166 for injecting molten metal 168 in reservoir 170 into blind cavities 152. At the actual fill point of cavities 152 when molten metal 168 is under pressure, the downward force of molding solder tool 166 maintains a tight seal between tapes 120 and 132 forming tape 150. After tape 150 passes the fill point, there is no longer any pressure on the molten metal 168, thus molten metal 168 will not leak from cavities 152 between tapes 120 and 132. Once molten metal 168 solidifies, the solid molten metal 168' itself provides a joining force between tapes 120 and 132. Third work station 160 has a cooled area 172 for cooling molten metal 168 below the temperature of molten metal 168 in blind cavities 152 to solidify molten metal 168 in blind cavities 152 to solidified molten metal 168'. After third work station 160, third tape 150 may continue along path 162 to a take-up reel 174. Take-up reel 174 may rotate around axis 176 in the direction shown by arrow 178.

Figure 18:
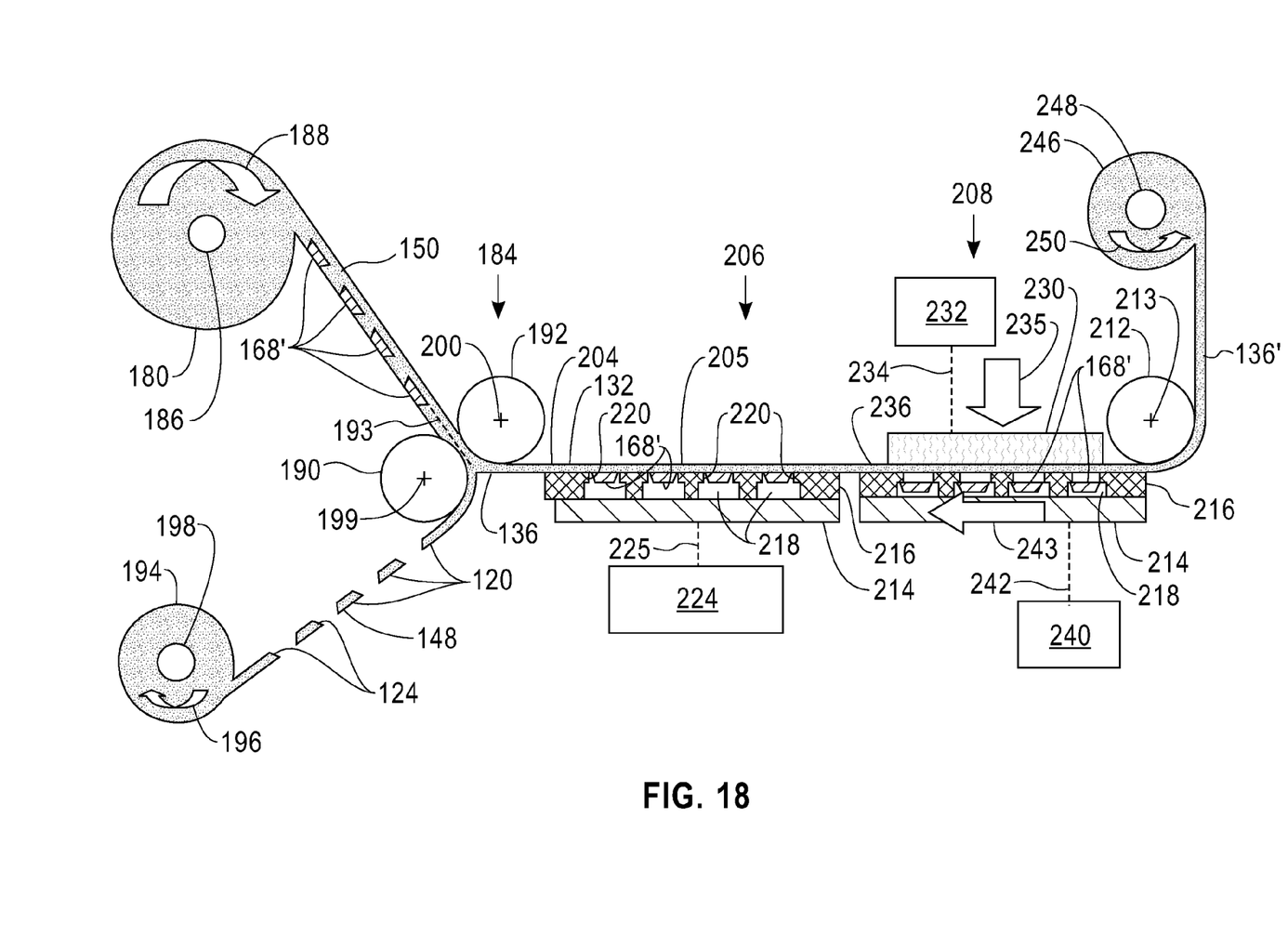
FIG. 18 is a cross-section view of a reel to reel apparatus for transferring metal arrays from a decal or tape to a substrate.

FIG. 18 is a cross-section view of a reel to reel apparatus for transferring metal arrays from a decal to a substrate. Decal reel 180 has stored thereon third tape 150 which is fed to first station 184. Decal reel 180 rotates around axis 186 in the clockwise direction shown by arrow 188. First station 184 has a first guide 190 and a second guide 192 which are spaced apart to provide a path 193 there between for third tape 150. After passing between guides 190 and 192, tape 150 is separated with a first tape 120 having through-hole cavities 124 rounding guide 190 along a path to cavity reel 194. Cavity reel 194 rotates in the clockwise direction as shown by arrow 196 around axis 198. First guide 190 may be a roller which may rotate about axis 199. Second guide 192 may be a roller which may rotate about axis 200.

After first tape 120 separates from third tape 150 in station 184, the remaining tape 204 contains decals 205 comprising arrays of solidified molten metal 168' on surface 136 on second tape 132. Second work station 206 and third work station 208 are positioned in series after first station 184 along path 210 taken by second tape 132 from between first guide 190 and second guide 192 to third guide 212. Third guide 212 may be a roller rotating about axis 213.

Second work station 206 has a substrate 214 with a first mask 216 thereon having corresponding openings 218 in a pattern matching a pattern of decals 205 having solidified metal 168' on surface 136 of tape 132. In station 206 openings 218 of first mask 216 are aligned with a respective decal 205 having a corresponding pattern of solidified metal 168'. First mask 216 may comprise at least one of a polymer, glass, semiconductor, metal, graphite and ceramic. First mask 216 may comprise silicon to match the coefficient of thermal expansion of substrate 214 which may comprise silicon. Openings 218 have a length, width and depth to receive solidified metal 168'. Openings 218 have sidewalls 220 to withstand predetermined lateral forces. Second workstation 206 has a means 224 for positioning a pattern of openings 218 to receive a pattern of solidified metal 168' on surface 136 on second layer 132 and for moving first mask 216 together with second layer 132 as second layer 132 is moved to third work station 208. Link 226 mechanically links means 224 to substrate 214.

Workstation 208 has a rigid plate 230 positioned on tape 132. Means 232 is mechanically linked to plate 230 by link 234 for applying pressure to lower surface 236 of second layer 132 as shown by arrow 235. Rigid plate 230 may have a low friction surface for tape 132 to slide over. Rigid plate 230 may comprise metal, wood, silicon, glass or a polymer. Means 240 has a link 242 attached to substrate 214 to provide transfer motion and to position substrate 214. Link 242 may be mechanically linked to substrate 214. Means 240 provides for moving substrate 214 and first mask 216 laterally with respect to second layer 132 as shown by arrow 243 to shear off solidified metal 168' in respective openings 218 of first mask 216. After solidified metal 168' has been sheared off surface 136 on second tape 132, means 240 provides for moving substrate 214, solidified metal 168' in openings 218 and first mask 216 away from second layer 132 whereby solidified metal 168' has been transferred to substrate 214. Second layer 136' without solidified metal 168' exits workstation 208 passes around guide 212 to take-up reel 246. Take-up reel 246 may rotate around axis 248 as shown by arrow 250 in a counter clockwise direction. Solidified metal 168' in respective openings 218 may be reflowed to bond to respective contacts not shown in FIG. 18 in openings 218. First mask 216 may then be removed from substrate 214.

Figure 19:
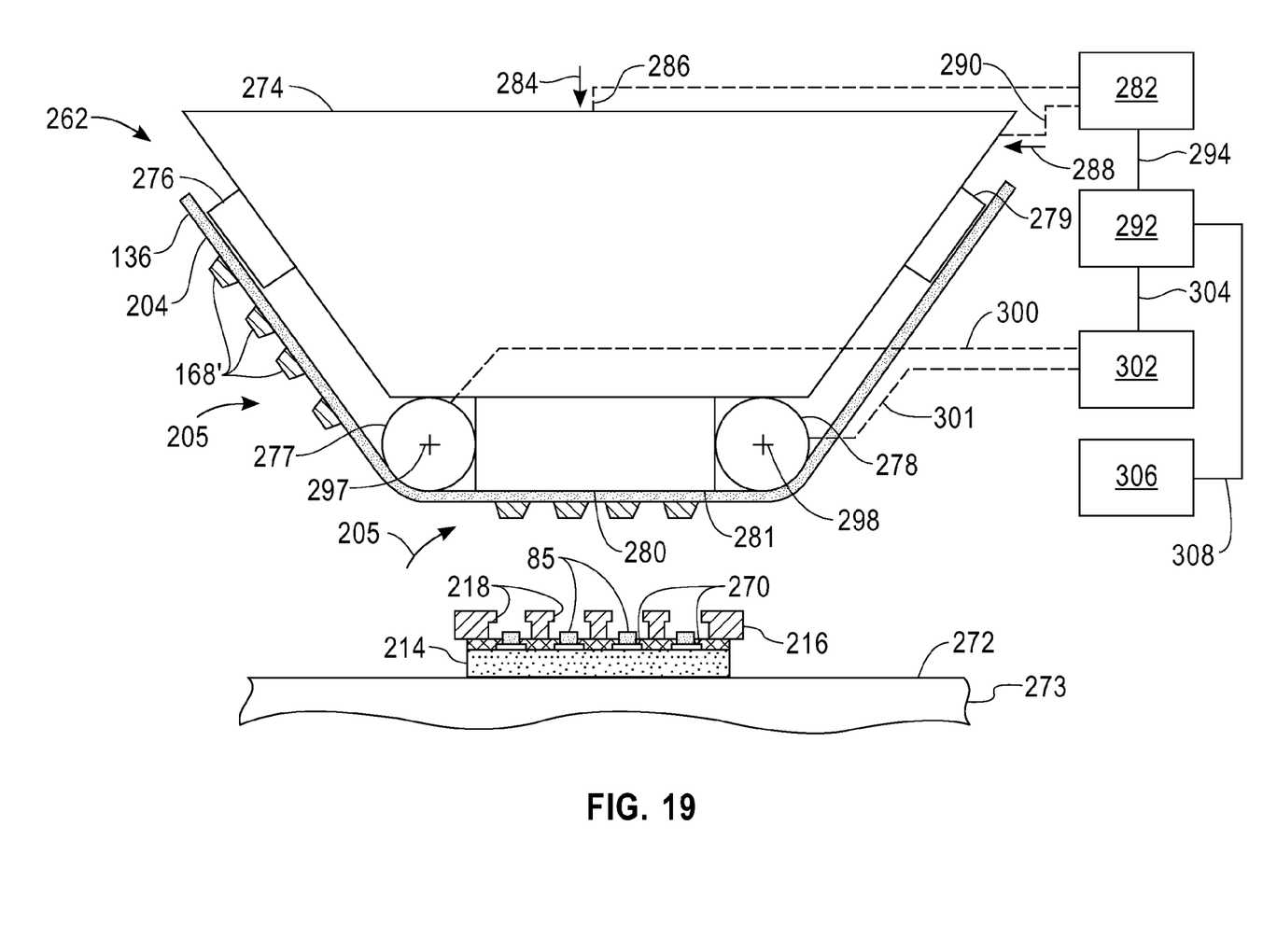
FIG. 19 is a cross-section view of an apparatus for transferring metal arrays on a decal or tape by shearing metal arrays from the decal or tape to a substrate.

FIG. 19 is a cross-section view of a tape head 262 for transferring metal arrays 205 on surface 136 of decal or tape 204 by shearing solidified metal 168' of metal arrays 205 from decal or tape 204 at respective openings 218 in mask 216 above flux 85 and contacts 270 on substrate 214. Substrate 214 is supported by surface 272 of support 273. Tape head 262 comprises a body 274, guides 276-279 and workstation 280. Tape head 262 is coupled to means such as motor 282 for positioning workstation 280 with respect to openings 218 in mask 216 above flux 85 and contacts 270 on substrate 214. Body 274 functions to hold or support guides 276-279 and workstation 280. Workstation 280 may include plate 281 having a low friction surface for tape 132 to slide over. Plate 281 may comprise metal, wood, silicon, glass or a polymer. Workstation 280 may be positioned by body 274 which can move in the z direction shown by arrow 284 via mechanical link 286 and in the x direction and the y direction shown by arrow 288 via mechanical link 290. Mechanical links 286 and 290 are connected to motor 282. Motor 282 is controlled by controller 292 which is coupled to motor 282 over lead 294. Optical or other alignment information with respect to metal array 205 and openings 218 in mask 216 may be provided by sensor 306 which is coupled over lead 308 to controller 292 for positioning workstation 280. The signals on leads 294, 304 and 308 may be bidirectional.

Decal or tape 204 is fed over guides 276 and 277, across workstation 280 and over guides 278 and 279. Guides 277 and 278 may be cylinders or rollers which may rotate about respective axis 297 and 298 via respective mechanical links 300 and 301 connected to motor 302. Motor 302 functions to position metal array 205 on work station 280. Motor 302 is controlled by controller 292 coupled over lead 304.

In FIGS. 1-19, the structures therein are not drawn to scale. In FIGS. 1-19, like references are used for the same functions or apparatus illustrated in a lower Figure.

While there has been described and illustrated an apparatus and methods for forming an array of metal (solder) performs, metal shapes and metal (solder) balls and for transferring an array to a matching array of openings in a mask on a substrate by mechanical shearing metal perform, metal shapes and metal balls of the array or by breaking a metal/polymer interface bond at a temperature below the melting temperature of the metal, it will be apparent to those skilled in the art that modifications and variations are possible without deviating from the broad scope of the invention which shall be limited solely by the scope of the claims appended hereto.

What is claimed is:

1. A method for transferring an array of metal balls on a polymer layer to an array of metal contacts on a substrate comprising:
   selecting an array of contacts on a substrate;
   forming a flux over respective contacts of said array of contacts on said substrate;
   forming on said substrate a first mask having through-hole openings corresponding to respective contacts of said array of contacts;
   said through-hole openings having a depth and a width for receiving metal balls of said array of metal balls on said polymer layer;
   said first mask having mechanical strength to maintain a shape of said through-hole openings under shear forces to permit shearing said metal balls of said array of metal balls;
   positioning respective metal balls of said array of metal balls on said polymer layer into said through-hole openings of said first mask;
   moving said first mask sideways with respect to said polymer layer and said array of metal balls at least the width of a metal ball to shear said array of metal balls and stopping said moving said first mask sideways whereby said metal balls of said array of metal balls are sheared free from said polymer layer in said through-hole openings over said flux and respective contacts;
   heating said metal balls to reflow said metal to bond to or wet said respective contacts in a presence of said flux; and
   solidifying said metal over said contacts.

2. The method of claim 1 further including placing a compliant layer over said polymer layer to hold said polymer layer in contact with said first mask.

3. The method of claim 1 further including removing said flux.

4. The method of claim 1 wherein said first mask comprises at least one of a polymer, glass, semiconductor, metal, graphite and ceramic.

5. The method of claim 1 further including removing said first mask.

6. The method of claim 1 wherein said selecting an array of contacts on a substrate comprises selecting an array of contacts on an organic substrate.

7. The method of claim 1 wherein said selecting an array of contacts on a substrate comprises selecting an array of contacts on a substrate comprising a polymer.

8. The method of claim 1 wherein forming a flux over respective contacts comprises forming a first alignment mask having openings above corresponding respective contacts; and applying flux through said first alignment mask opening to respective contacts to fill said openings with flux;

lifting off said first alignment mask from said substrate leaving pedestals of flux having a flat upper surface.

9. The method of claim 8 wherein said applying flux further comprises positioning said flux on said first alignment mask; and moving said flux with a squeegee positioned behind said flux over said first alignment mask whereby said openings in said first alignment mask are filled.

10. The method of claim 8 further including forming a layer on said substrate having openings to permit access to said respective contacts and aligned with openings in said first alignment mask; and wherein said applying flux includes applying flux through said openings in said first alignment mask and said layer.

* * * * *